(12) United States Patent
Xie et al.

(10) Patent No.: US 10,014,379 B2
(45) Date of Patent: Jul. 3, 2018

(54) METHODS OF FORMING SEMICONDUCTOR DEVICE WITH SELF-ALIGNED CONTACT ELEMENTS AND THE RESULTING DEVICE

(71) Applicant: GLOBALFOUNDRIES Inc., Grand Cayman (KY)

(72) Inventors: Ruilong Xie, Niskayuna, NY (US); Xiuyu Cai, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 334 days.

(21) Appl. No.: 14/526,980

(22) Filed: Oct. 29, 2014

(65) Prior Publication Data

US 2017/0077247 A1 Mar. 16, 2017

Related U.S. Application Data

(62) Division of application No. 13/743,454, filed on Jan. 17, 2013, now Pat. No. 8,928,048.

(51) Int. Cl.
| | |
|---|---|
| H01L 21/8238 | (2006.01) |
| H01L 29/417 | (2006.01) |
| H01L 29/78 | (2006.01) |
| H01L 29/66 | (2006.01) |
| H01L 21/768 | (2006.01) |

(52) U.S. Cl.
CPC .. *H01L 29/41783* (2013.01); *H01L 21/76897* (2013.01); *H01L 29/41791* (2013.01); *H01L 29/6653* (2013.01); *H01L 29/6656* (2013.01); *H01L 29/66515* (2013.01);

(Continued)

(58) Field of Classification Search
CPC ............ H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66
USPC ........ 438/696–702, 233, 390–400, 652–653; 257/368, 369, 77, 401, 347, 412, 190, 257/315, 365, 253
See application file for complete search history.

(56) References Cited

U.S. PATENT DOCUMENTS

| | | |
|---|---|---|
| 4,440,804 A | 4/1984 | Milgram |
| 4,466,172 A | 8/1984 | Batra |

(Continued)

*Primary Examiner* — Moin Rahman
(74) *Attorney, Agent, or Firm* — Amerson Law Firm, PLLC

(57) ABSTRACT

One method disclosed includes forming a final gate structure in a gate cavity that is laterally defined by sidewall spacers, removing a portion of the sidewall spacers to define recessed sidewall spacers, removing a portion of the final gate structure to define a recessed final gate structure and forming an etch stop on the recessed sidewall spacers and the recessed final gate structure. A transistor device disclosed herein includes a final gate structure that has an upper surface positioned at a first height level above a surface of a substrate, sidewall spacers positioned adjacent the final gate structure, the sidewall spacers having an upper surface that is positioned at a second, greater height level above the substrate, an etch stop layer formed on the upper surfaces of the sidewall spacers and the final gate structure, and a conductive contact that is conductively coupled to a contact region of the transistor.

17 Claims, 6 Drawing Sheets

(52) U.S. Cl.
CPC .. *H01L 29/66545* (2013.01); *H01L 29/66795* (2013.01); *H01L 29/78* (2013.01); *H01L 29/7851* (2013.01)

(56) References Cited

U.S. PATENT DOCUMENTS

| | | | |
|---|---|---|---|
| 4,517,729 A | 5/1985 | Batra | |
| 5,106,783 A | 4/1992 | Chin et al. | |
| 5,266,523 A | 11/1993 | Manning | |
| 5,665,623 A | 9/1997 | Liang et al. | |
| 6,025,255 A | 2/2000 | Chen et al. | |
| 6,096,644 A | 8/2000 | Lukanc | |
| 6,165,880 A | 12/2000 | Yaung et al. | |
| 6,258,714 B1 | 7/2001 | Shrivastava | |
| 6,265,296 B1 | 7/2001 | Yen et al. | |
| 6,268,281 B1 | 7/2001 | Shih et al. | |
| 6,291,860 B1 | 9/2001 | Lukanc | |
| 6,329,252 B1 | 12/2001 | Lin | |
| 6,348,379 B1 | 2/2002 | Wang et al. | |
| 6,359,307 B1 | 3/2002 | Wang et al. | |
| 6,509,229 B1 | 1/2003 | Wang et al. | |
| 6,521,540 B1 | 2/2003 | Li | |
| 6,607,955 B2 | 8/2003 | Lee | |
| 6,885,052 B2 | 4/2005 | Ahn et al. | |
| 6,937,768 B2 | 9/2005 | Jeng | |
| 7,098,114 B1 | 8/2006 | Syau et al. | |
| 7,126,198 B2 | 10/2006 | Steiner et al. | |
| 7,132,708 B2 | 11/2006 | Ahn et al. | |
| 7,332,775 B2 | 2/2008 | Steiner et al. | |
| 7,382,054 B2 | 6/2008 | Luoh et al. | |
| 7,563,701 B2 | 7/2009 | Chang et al. | |
| 7,575,990 B2 | 8/2009 | Wei | |
| 7,582,567 B1 | 9/2009 | Syau et al. | |
| 7,888,804 B2 | 2/2011 | Luoh et al. | |
| 2003/0036240 A1* | 2/2003 | Trivedi | H01L 21/76895 438/383 |
| 2004/0121548 A1* | 6/2004 | Fishburn | H01L 21/31053 438/279 |
| 2006/0128055 A1* | 6/2006 | Cheng | H01L 29/6656 438/83 |
| 2007/0202651 A1* | 8/2007 | Zhang | H01L 29/66772 438/296 |
| 2007/0241411 A1 | 10/2007 | Yang et al. | |
| 2010/0038715 A1 | 2/2010 | Babich et al. | |
| 2010/0155743 A1 | 6/2010 | Treu et al. | |
| 2010/0311231 A1 | 12/2010 | Thei et al. | |
| 2011/0156107 A1 | 6/2011 | Bohr et al. | |
| 2012/0139061 A1* | 6/2012 | Ramachandran | H01L 21/76895 257/410 |
| 2012/0273848 A1* | 11/2012 | Fan | H01L 21/823418 257/288 |
| 2013/0320411 A1* | 12/2013 | Fan | H01L 29/78 257/288 |
| 2014/0110793 A1* | 4/2014 | Hong | H01L 21/823807 257/369 |

* cited by examiner

METHODS OF FORMING SEMICONDUCTOR DEVICE WITH SELF-ALIGNED CONTACT ELEMENTS AND THE RESULTING DEVICE

CROSS-REFERENCE TO RELATED APPLICATION

This is a divisional of co-pending application Ser. No. 13/743,454, filed Jan. 17, 2013.

BACKGROUND OF THE INVENTION

1. Field of the Invention

The present disclosure generally relates to the fabrication of integrated circuits, and, more particularly, to various methods of forming self-aligned contacts for a semiconductor device, and the resulting semiconductor device.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

By using such field effect transistors, more complex circuit components may be composed, such as inverters and the like, thereby forming complex logic circuitry, embedded memories and the like. Over the recent years, due to the reduced dimensions of the transistor devices, the operating speed of the circuit components has been increased with every new device generation and the "packing density" in such products has been increased over the recent years. Such improvements in the performance of transistor devices has reached the point where the limiting factor of the finally achieved operating speed of complex integrated circuit products is no longer the individual transistor element but the electrical performance of the complex wiring system that is formed above the device level including the actual semiconductor-based circuit elements. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer. In some applications, the second end of the contact structure may be connected to a contact region of a further semiconductor-based circuit element, in which case the interconnect structure in the contact level is also referred to as a local interconnect. The contact structure may comprise contact elements or contact plugs having a generally square-like or round shape that are formed in an interlayer dielectric material, which in turn encloses and passivates the circuit elements. As the critical dimensions of the circuit elements in the device level decreased, the dimensions of metal lines, vias and contact elements were also reduced. In some cases, the increased packing density mandated the use of sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels, metal lines and vias having critical dimensions of approximately 100 nm and significantly less may have to be provided in order to achieve the required packing density in accordance with density of circuit elements in the device level.

As device dimensions have decreased, e.g., transistors with gate lengths of 50 nm and less, the contact elements in the contact level have to be provided with critical dimensions in the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

For this reason, contact technologies have been developed in which contact openings are formed in a self-aligned manner by removing dielectric material, such as silicon dioxide, selectively from the spaces between closely spaced gate electrode structures. That is, after completing the transistor structure, the gate electrode structures are used as etch masks for selectively removing the silicon dioxide material in order to expose the contact regions of the transistors, thereby providing self-aligned trenches which are substantially laterally delineated by the spacer structures of the gate electrode structures. Consequently, a corresponding lithography process only needs to define a global contact opening above an active region, wherein the contact trenches then result from the selective etch process using the gate electrode structures, i.e., the portions exposed by the global contact opening, as an etch mask. Thereafter, an appropriate contact material, such as tungsten and the like, may be filled into the contact trenches.

However, the aforementioned process of forming self-aligned contacts results in an undesirable loss of the materials that protect the conductive gate electrode, i.e., the gate cap layer and the sidewall spacers, as will be explained with reference to FIGS. 1A-1B. FIG. 1A schematically illustrates a cross-sectional view of an integrated circuit product 10 at an advanced manufacturing stage. As illustrated, the product 10 comprises a plurality of illustrative gate structures 11 that are formed above a substrate 12, such as a silicon substrate. The gate structures 11 are comprised of an illustrative gate insulation layer 13 and an illustrative gate electrode 14. An illustrative gate cap layer 16 and sidewall spacers 18 encapsulate and protect the gate structures 11. The gate cap layer 16 and sidewall spacers 18 are typically made of silicon nitride. Also depicted in FIG. 1A are a plurality of raised source/drain regions 20 and a layer of insulating material 22, e.g., silicon dioxide. FIG. 1B depicts the product 10 after an opening 24 has been formed in the layer of insulating material 22 for a self-aligned contact. Although the contact etch process performed to form the opening 24 is primarily directed at removing the desired portions of the layer of insulating material 22, portions of the protective gate cap layer 16 and the protective sidewall spacers 18 get consumed during the contact etch process, as simplistically depicted in the dashed regions 26. Given that the cap layer 16 and the spacers 18 are attacked in the contact etch process, the thickness of these protective materials must be sufficient such that, even after the contact etch process is completed, there remains sufficient material to protect the gate structures 11. Accordingly, device manufacturers tend to make the cap layers 16 and spacers 18 having an additional thickness that may otherwise not be required but for the consumption of the cap layers 16 and the spacers 18 during the contact etch process. In turn, increasing the thickness of such structures, i.e., increasing the thickness of the gate cap layers 16, causes other problems such as increasing the aspect ratio of the contact opening 24 due to the increased height, increasing the initial gate height which makes the gate etching and spacer etching processes more difficult, etc.

The present disclosure is directed to various methods of forming self-aligned contacts for a semiconductor device, and the resulting semiconductor device, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming self-aligned contacts for a semiconductor device, and the resulting semiconductor device. One method disclosed includes forming a final gate structure in a gate cavity that is laterally defined by sidewall spacers, removing a portion of the sidewall spacers to define recessed sidewall spacers, removing a portion of the final gate structure to define a recessed final gate structure and forming an etch stop on the recessed sidewall spacers and the recessed final gate structure.

A further illustrative method disclosed herein includes forming a final gate structure in a gate cavity that is laterally defined by sidewall spacers positioned in a first layer of insulating material, removing a portion of the sidewall spacers to define recessed sidewall spacers and a spacer cavity having a first depth relative to an upper surface of the first layer of insulating material, removing a portion of the final gate structure to define a recessed final gate structure cavity that has a second depth relative to the upper surface of the first layer of insulating material that is greater than the first depth, and forming an etch stop layer on at least the recessed sidewall spacers and the recessed final gate structure, wherein the etch stop layer has a stepped profile when viewed in cross-section.

One illustrative transistor device disclosed herein includes a final gate structure that has an upper surface positioned at a first height level above a surface of a substrate, sidewall spacers positioned adjacent the final gate structure, the sidewall spacers having an upper surface that is positioned at a second, greater height level above the substrate, an etch stop layer formed on the upper surfaces of the sidewall spacers and the final gate structure, and a conductive contact that is conductively coupled to a contact region of the transistor.

BRIEF DESCRIPTION OF THE DRAWINGS

The disclosure may be understood by reference to the following description taken in conjunction with the accompanying drawings, in which like reference numerals identify like elements, and in which.

Figure 1A:
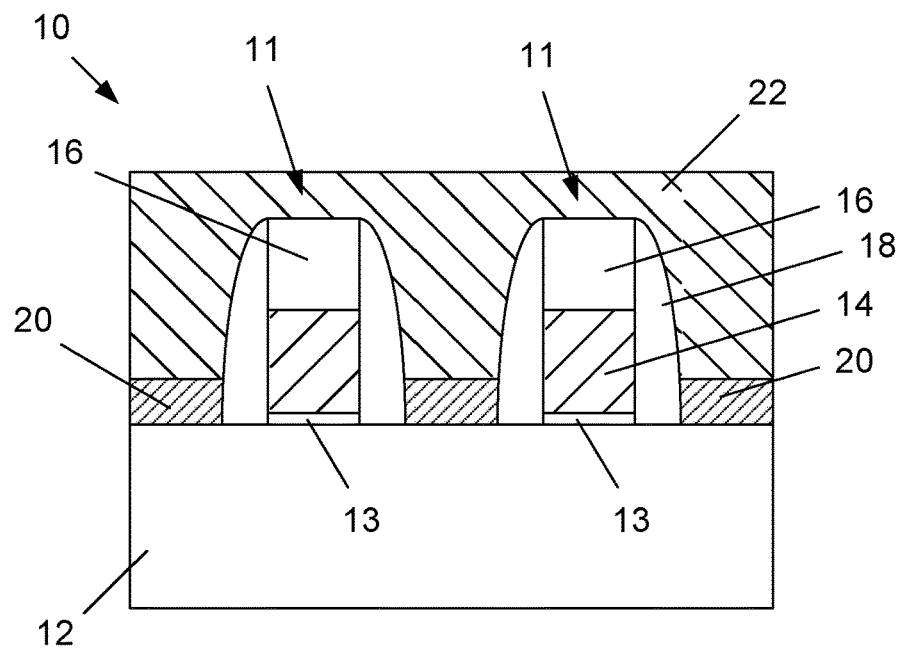
FIGS. 1A-1B schematically illustrate a cross-sectional view of an illustrative integrated circuit product that employs self-aligned contacts.
Figure 1B:
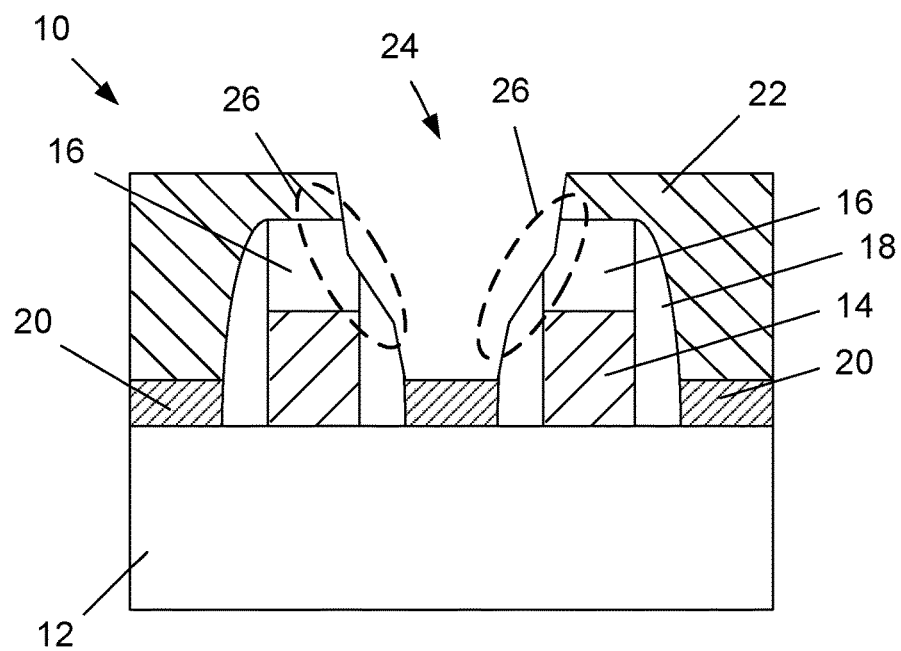

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming self-aligned contacts for a semiconductor device, and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail.

Figure 2A:
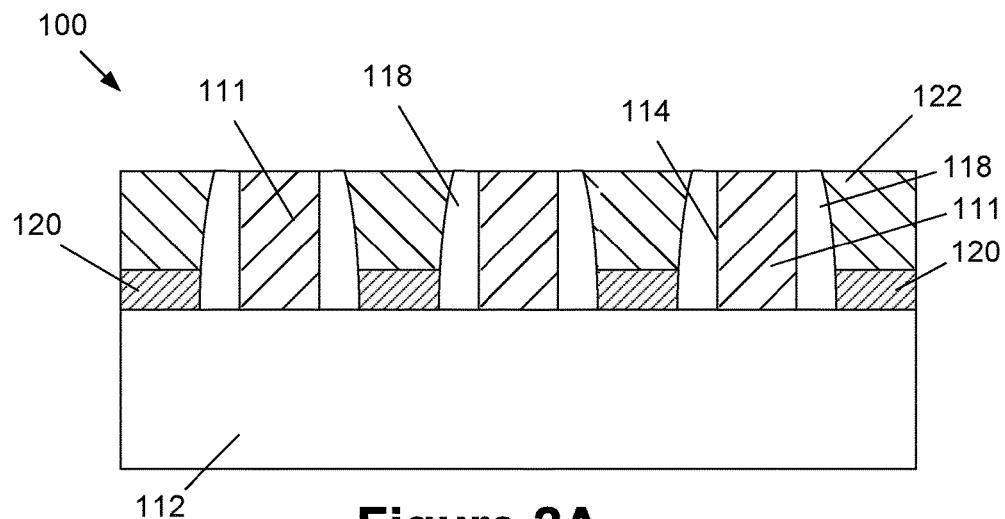
FIGS. 2A-2J depict various illustrative methods disclosed herein for forming self-aligned contacts for a semiconductor device, and the resulting semiconductor devices.

FIG. 2A schematically illustrates a cross-sectional view of an integrated circuit product 100 at an advanced stage of manufacturing. As illustrated, the product 100 comprises a plurality of illustrative final gate structures 111 that are formed above a substrate 112. The substrate 112 may have a variety of configurations, such as the depicted bulk substrate configuration. The substrate 112 may have an SOI (silicon-on-insulator) configuration wherein the semiconductor devices are formed in the active layer of the SOI substrate. The substrate 112 may be made of silicon or it may be made of materials other than silicon. Thus, the terms "substrate" or "semiconducting substrate" should be understood to cover all semiconducting materials and all forms of such materials. The invention disclosed herein will be disclosed in the context of forming planar transistor devices. However, as will be recognized by those skilled in the art after a complete reading of the present application, the inventions disclosed herein may be applied to the formation of planar FET devices as well as 3D devices, such as FinFET devices. Moreover, the methods disclosed herein are applicable to forming any type of device, e.g., an NFET device, a PFET device, etc.

With continuing reference to FIG. 2A, the final gate structures 111 are intended to be representative in nature of any type of gate structure that may be employed in manufacturing integrated circuit products using a so-called gate-last or replacement-gate manufacturing technique. In general, the final gate structures 111 are comprised of one or more gate insulation layers, such as, for example, silicon dioxide, a so-called high-k (k greater than 10) insulation material (where k is the relative dielectric constant), etc., and one or more conductive layers that act as the gate electrode, e.g., titanium nitride, tantalum nitride, a doped polysilicon material, tungsten, aluminum, etc. In the replacement-gate technique, a so-called "dummy" or sacrificial gate structure (not shown) including a gate cap layer is initially formed above the substrate 112 and patterned. Thereafter, the sidewall spacers 118 are formed adjacent the patterned dummy gate structure/cap layer. The dummy gate structure remains in place as many process operations are performed to form the device, e.g., the formation of doped source/drain regions, performing an anneal process to repair damage to the substrate caused by the ion implantation processes and to activate the implanted dopant materials. At some point in the process flow, the gate cap layer is removed by performing a chemical mechanical polishing (CMP) process relative to a layer of insulating material so as to expose the dummy gate structure for further processing. Thereafter, one or more etching processes are performed to remove the dummy gate structure which results in the formation of a gate cavity that is laterally defined by the spacers where the final gate structure 111 for the device is formed. For example, after the dummy gate is removed, a conformal chemical vapor deposition (CVD) or atomic layer deposition (ALD) process may be performed to conformably deposit a gate insulation layer comprised of a high-k layer of insulating material, e.g., hafnium oxide, in the gate cavity. Thereafter, one or more metal layers (that will become the gate electrode) may be deposited in the gate cavity above the gate insulation layer. A CMP process is then performed to remove excess portions of the deposited layers of material positioned outside the gate cavity. These operations result in the schematically depicted final gate structures 111.

While still referencing FIG. 2A, the illustrative sidewall spacers 118 that were formed adjacent the dummy gate structure (not shown), e.g., silicon nitride spacers, encapsulate and protect portions of the final gate structure 111. The spacers 118 were formed by depositing a layer of spacer material adjacent the dummy gate structure and thereafter performing an anisotropic etching process on the layer of spacer material. Also depicted in FIG. 2A are a plurality of raised source/drain regions 120 and a layer of insulating material 122, e.g., silicon dioxide. The raised source/drain regions 120 are provided by way of example, as the inventions disclosed herein may be employed with devices having any type of source/drain regions, e.g., raised or planar. FIG. 2A depicts the device 100 after several process operations have been performed, i.e., gate cap removal, dummy gate removal to thereby define the gate cavity 114 (between the spacers 118) where the final gate structure 111 will be formed, formation of various layers of material that will make up the final gate structure 111 and after a CMP process was performed.

Figure 2B:
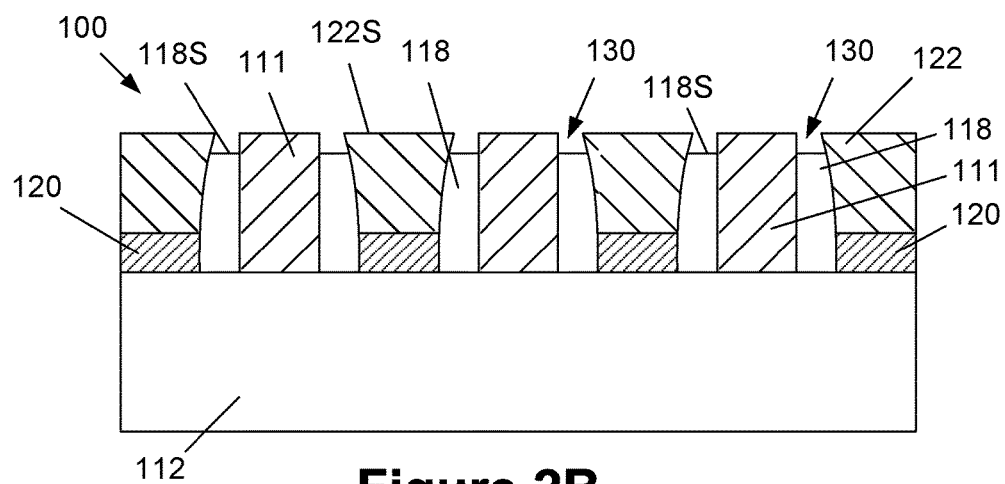

FIG. 2B depicts the product 100 after a timed, recess etching process has been performed to selectively remove portions of the sidewall spacers 118 to thereby define recessed sidewall spacers that define, at least in part, a spacer cavity 130. In one illustrative embodiment, the spacer cavity 130 may have a depth on the order of about 10 nm relative to the upper surface 122S of the layer of insulating material 122. In one illustrative embodiment, the etching process performed to form the spacer cavity 130 may be an anisotropic etching process. The recessed spacers have an upper surface 118S that is positioned at a first height level above the surface of the substrate 112.

Figure 2C:
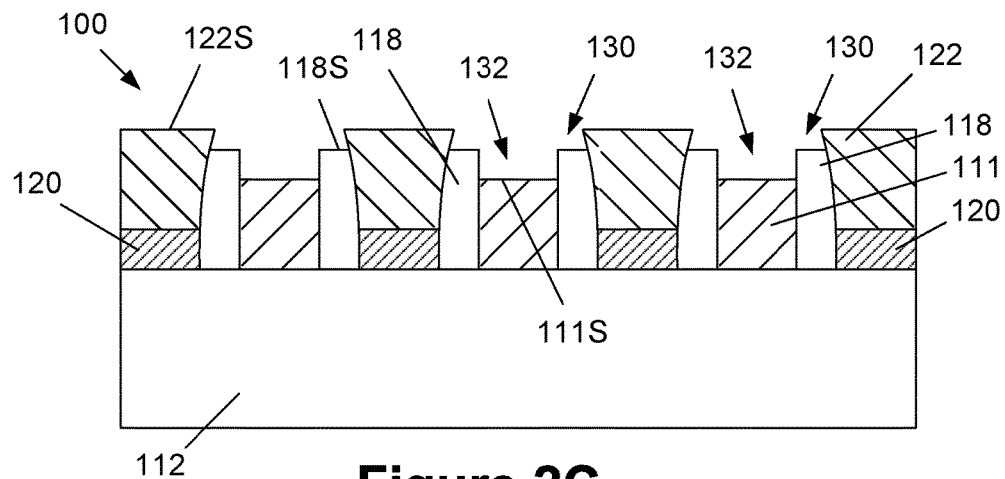

FIG. 2C depicts the product 100 after a timed, recess etching process has been performed to selectively remove portions of the final gate structure 111 to thereby define a final gate structure having a recessed upper surface 111S that defines, in part, a recessed final gate structure cavity 132 above the remaining portions of the final gate structure 111. In one illustrative embodiment, the recessed final gate structure cavity 132 may have a depth on the order of about 5-15 nm relative to the upper surface 118S of the spacer 118, i.e., the depth of the recessed final gate structure cavity 132 may be about 15-25 nm relative to the upper surface 122S of the layer of insulating material 122. In one illustrative embodiment, the etching process performed to form the recessed final gate structure cavity 132 may be an anisotropic etching process. The upper surface 111S of the recessed final gate structure 111 after the recessing process is positioned at a second height level above the surface of the substrate 112, wherein the second height level is less than the first height level of the surface 118S of the spacers 118.

Figure 2D:
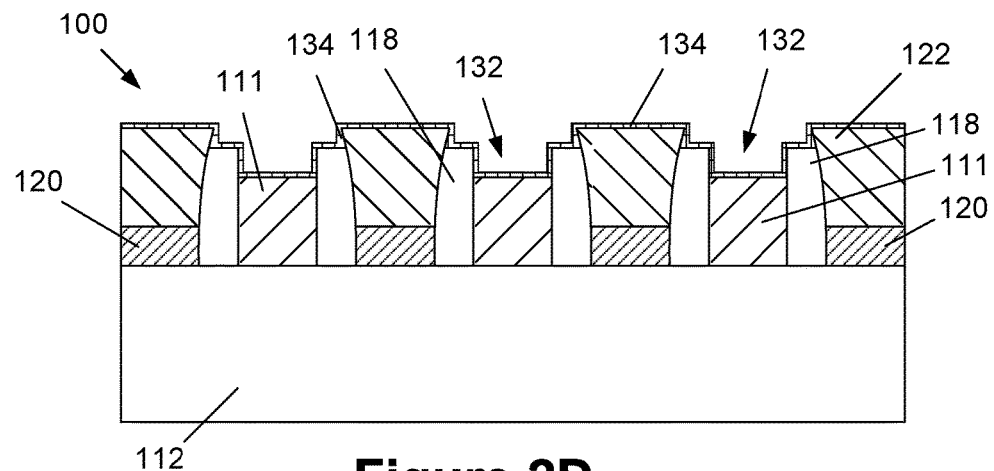

FIG. 2D depicts the product 100 after a conformal deposition process, e.g., a CVD process, an ALD process, etc., has been performed to form an etch stop liner 134 on the product 100. The thickness of the etch stop liner 134 may vary depending upon the particular application, e.g., it may have a thickness of about 2-5 nm. In general, the etch stop liner 134 may be made of a material that may be selectively etched relative to the layer of insulating material 122 and the spacers 118. For example, the etch stop liner 134 may be comprised of a high-k material (k value greater than about 8), e.g., hafnium oxide, aluminum oxide, etc., or $Al_2O_3$, etc.

Figure 2E:
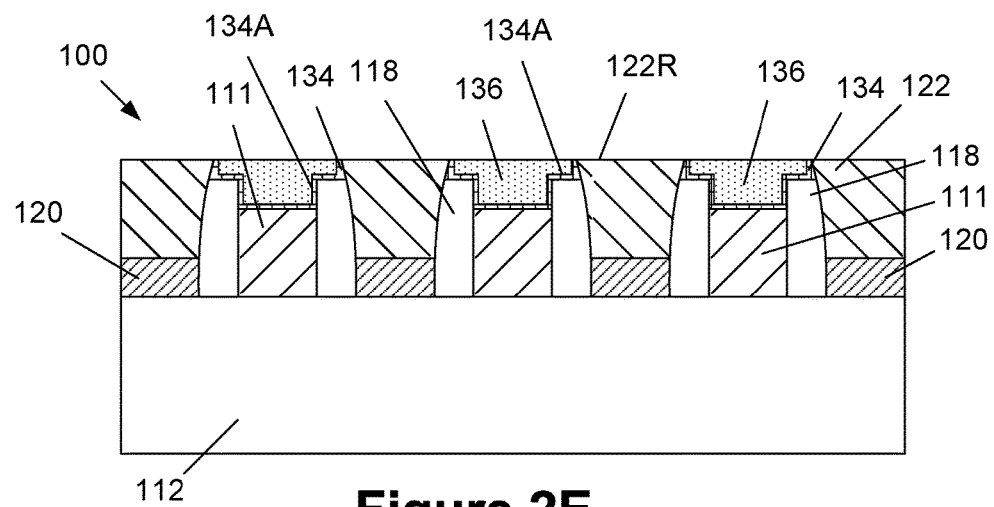

FIG. 2E depicts the product 100 after several process operations have been performed. First, a layer of insulating material 136 was deposited above the product 100. Thereafter, one or more CMP processes (or one or more etch back processes) were performed to remove excess portions of the layer of insulating material 136 and the etch stop liner 134 positioned above the planarized surface 122R of the layer of insulating material 122. This results in generally U-shaped layers of the etch stop liner 134 positioned above each of the gate structures 111 wherein the sidewalls of the etch stop liner 134 have a generally stair-shaped or notched configuration when viewed in cross-section. At this point, each of the etch stop liners 134 defines an etch stop cavity 134A. As depicted, in one embodiment, portions of the layer of insulating material 136 are positioned in the etch stop cavity 134A defined by the U-shaped portions of the etch stop liner 134. The layer of insulating material 136 may be comprised of a variety of insulating materials. In one illustrative embodiment, where the layer of insulating material 136 is comprised of an HDP oxide, the layer of insulating material 136 may be comprised of a HARP oxide or a low-k material.

Figure 2F:
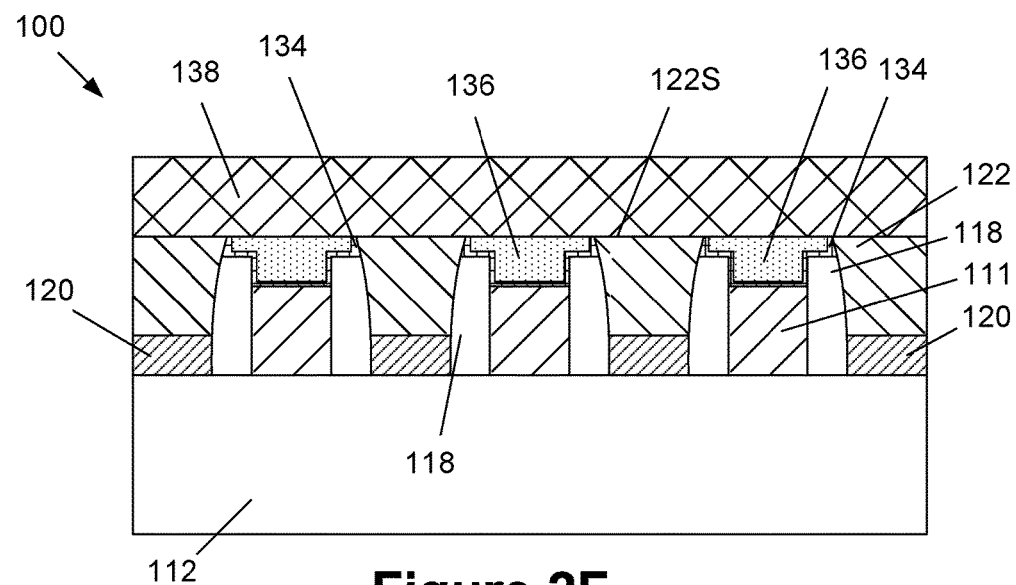

FIG. 2F depicts the product 100 after a layer of insulating material 138 has been deposited across the product 100. The layer of insulating material 138 may be comprised of a variety of different materials, such as silicon dioxide, a low-k oxide, etc., and it may be formed by performing a variety of techniques, e.g., CVD, etc. The thickness of the layer of insulating material 138 may vary depending upon the particular application.

Figure 2G:
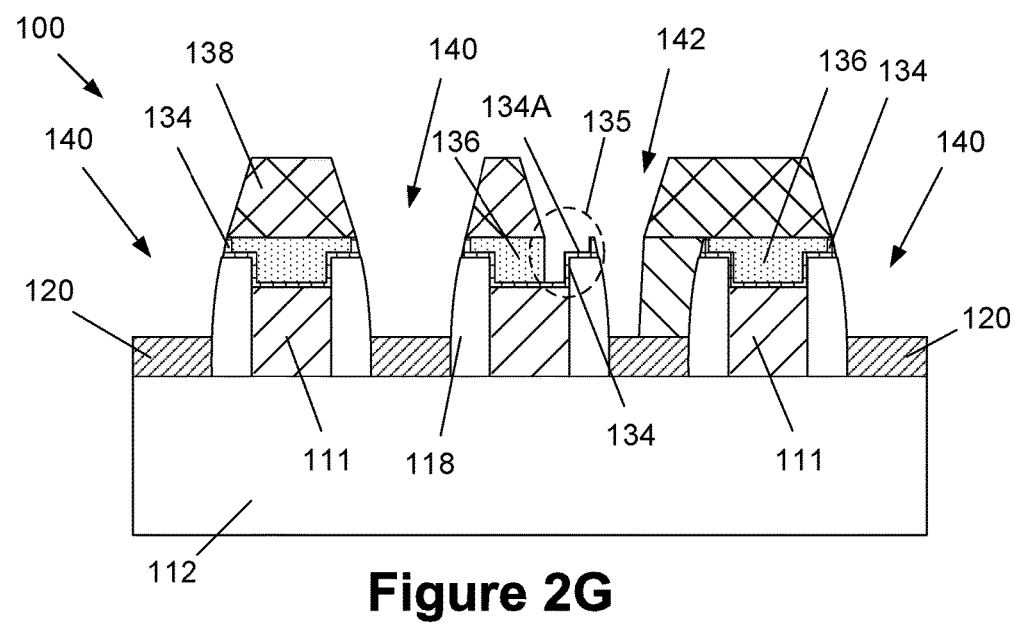

FIG. 2G depicts the product 100 after one or more etching process were performed on the product 100 to define a plurality of contact openings 140, 142. In the depicted example, the contact openings 140 are depicted as being precisely aligned relative to the final gate structures 111, while the contact opening 142 is depicted as being misaligned relative to the middle final gate structure 111. That is, portions of the opening 142 overlap the middle final gate structure 111. Such misalignment may occur for a variety of reasons in manufacturing integrated circuit devices. When the etching process is performed to define the openings 140, 142, a portion of a layer of insulating material 136 that was positioned in the etch stop cavity 134A above the middle final gate structure 111 was removed to thereby define a cavity 135 above a portion of the etch stop liner 134. The chemistry used in the etching process performed to define the contact openings 140, 142 is designed to remove the desired portions of the layers of insulating material 122, 138 while still being highly selective relative to the materials of the etch stop liner 134, e.g., a high-k insulating material. In one illustrative embodiment, the etching process performed to form the contact openings 140, 142 is an anisotropic etching process. The physical size and cross-sectional configuration of the openings 140, 142 may vary depending upon the particular application. The openings 140, 142 expose a contact region of the transistor, e.g., a source/drain region, etc.

Figure 2H:
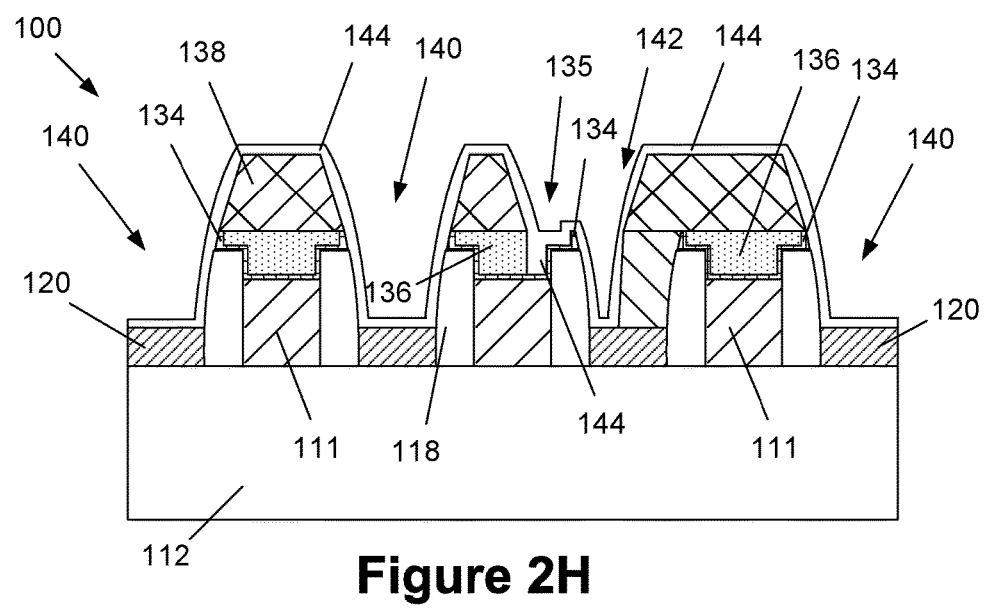

FIG. 2H depicts the product 100 after a conformal deposition process, e.g., an ALD process, etc., has been performed to form a dielectric layer 144, e.g., a layer of silicon dioxide, a low-k oxide, silicon nitride, a low-k silicon nitride, etc., on the product 100. The thickness of the dielectric layer 144 may vary depending upon the particular application, e.g., it may have a thickness of about 3-10 nm. The formation of the layer 144 effectively fills the cavity 135 (see FIG. 2G).

Figure 2I:
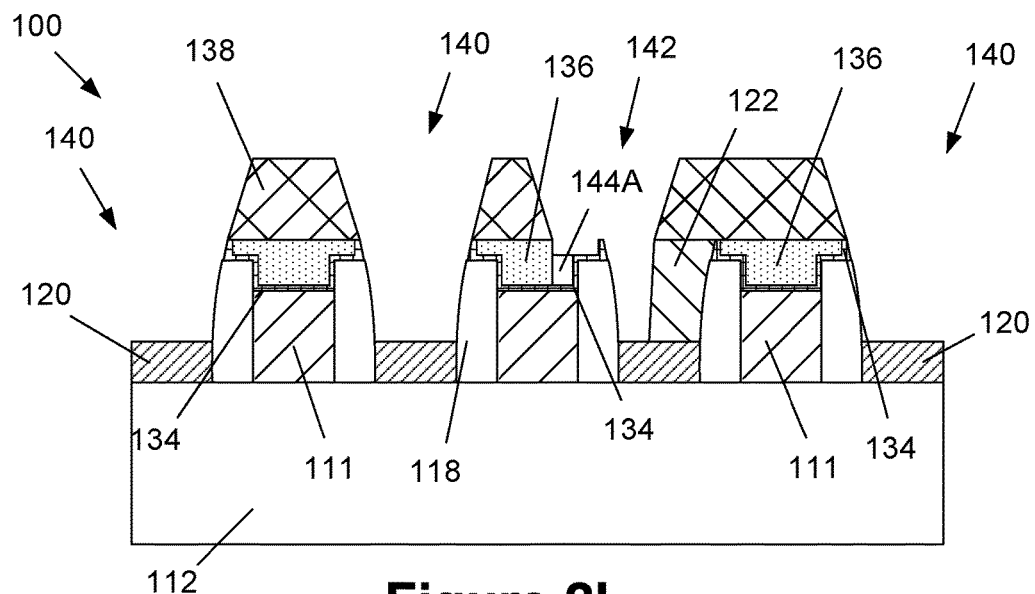

FIG. 2I depicts the product 100 after an isotropic etch back process was performed on the dielectric layer 144. This process effectively leaves a residual portion 144A of the dielectric layer 144 in the cavity 135 positioned adjacent the layer of insulating material 136 positioned in the etch stop cavity 134A. In the case where there is no misalignment of the contact openings, where only precisely aligned openings 140 are present, then substantially all of the layer of the dielectric layer 144 will be removed during this isotropic etch back process, i.e., the etch stop cavity 134A will be substantially filled by the layer of insulating materials 136. However, where there is misalignment, the layer 144 acts to effectively fill any cavity 135 above the affected final gate structure 111.

Figure 2J:
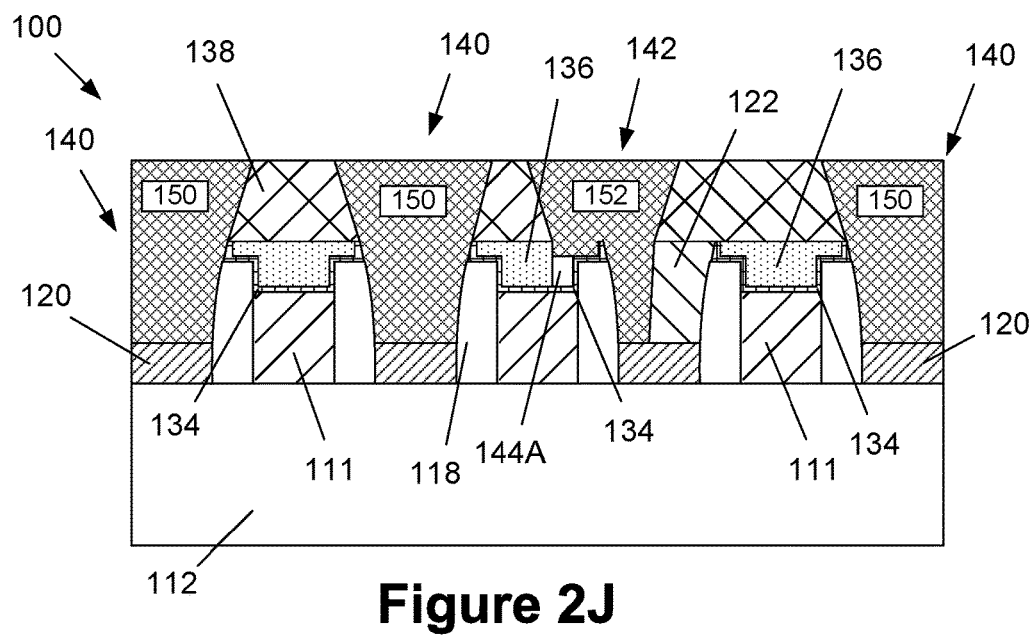

FIG. 2J depicts the product 100 after conductive contact structures 150, 152 have been formed in the contact openings such that they are conductively coupled to the contact region of the transistor. The contact structures 150, 152 are intended to be schematic and representative in nature, as they may be formed using any of a variety of different conductive materials and by performing traditional manufacturing operations. The contact structures 150, 152 may also contain one or more barrier layers (not depicted). In one illustrative example, the contact structures 150, 152 may be formed by depositing a liner, e.g., a titanium nitride liner, followed by overfilling the openings 140, 142 with a conductive material, such as tungsten. Thereafter, a CMP process may be performed to planarize the upper surface of the layer of insulating material 138 which results in the removal of excess portions of the liner and the tungsten positioned above the layer of insulating material 138 outside of the openings 140, 142 and the formation of the conductive contacts 150, 152. In the case of the illustrative misaligned contact 152, it contacts a portion of the side surface of the layer of insulating material 136 and it also contacts an upper surface of the residual portion 144A of the dielectric layer 144. The materials of the layers 136, 144 may be the same or they may be comprised of different materials. In general, the lateral width of the portion 144A corresponds approximately to the amount by which the contact 152 overlaps the final gate structure 111.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A transistor device, comprising:
    a final gate structure positioned above a semiconducting substrate, said final gate structure having an upper surface that is positioned at a first height level above a surface of said substrate;
    sidewall spacers positioned adjacent said final gate structure, said sidewall spacers having an upper surface that is positioned at a second height level above said surface of said substrate, wherein said second height level is greater than said first height level;
    an etch stop layer formed on and covering said upper surfaces of said sidewall spacers and an entirety of said upper surface of said final gate structure between said sidewall spacers, wherein said etch stop layer defines a stepped etch stop cavity that is positioned above said final gate structure and partially between said sidewall spacers;
    a first layer of insulating material formed above said substrate and said final gate structure;
    second and third layers of insulating material positioned side by side within said stepped etch stop cavity; and
    a conductive contact positioned in an opening formed in at least said first layer of insulating material, wherein said conductive contact is in contact with a side surface of said second layer of insulating material and an upper surface of said third layer of insulating material, said conductive contact being conductively coupled to a contact region of said transistor.

2. The device of claim 1, wherein said etch stop layer comprises one of $Al_2O_3$ or a high-k insulating material.

3. The device of claim 1, wherein said sidewall spacers are comprised of silicon nitride, said first layer of insulating material is comprised of silicon dioxide and said etch stop layer is comprised of a high-k insulating material.

4. The device of claim 1, wherein said contact region is a source/drain region.

5. The device of claim 1, wherein said transistor is one of a planar FET or a FinFET.

6. The device of claim 1, wherein a portion of said etch stop layer has a stepped profile when viewed in cross-section.

7. The device of claim 1, wherein at least one further layer of insulating material is positioned in said stepped etch stop cavity.

8. The device of claim 1, wherein said second and third layers of insulating material positioned within said stepped etch stop cavity are comprised of the same materials.

9. A transistor device, comprising:
    a final gate structure positioned above a semiconducting substrate, said final gate structure having an upper surface that is positioned at a first height level above a surface of said substrate;
    sidewall spacers positioned adjacent said final gate structure, said sidewall spacers having an upper surface that is positioned at a second height level above said surface of said substrate, wherein said second height level is greater than said first height level;
    an etch stop layer formed on and covering said upper surfaces of said sidewall spacers and an entirety of said upper surface of said final gate structure between said sidewall spacers, said etch stop layer defining an etch stop cavity having a stepped profile when viewed in cross-section and that is positioned above said final gate structure and partially between said sidewall spacers;

a first layer of insulating material positioned in and completely filling said etch stop cavity and completely covering all inner surfaces of said etch stop layer;

a second layer of insulating material positioned above said substrate, said first layer of insulating material and said final gate structure; and a conductive contact positioned in an opening formed in at least said second layer of insulating material, said conductive contact being conductively coupled to a contact region of said transistor.

10. A transistor device, comprising:

a final gate structure positioned above a semiconducting substrate, said final gate structure having an upper surface that is positioned at a first height level above a surface of said substrate;

sidewall spacers positioned adjacent said final gate structure, said sidewall spacers having an upper surface that is positioned at a second height level above said surface of said substrate, wherein said second height level is greater than said first height level;

an etch stop layer formed on and covering said upper surfaces of said sidewall spacers and an entirety of said upper surface of said final gate structure between said sidewall spacers, said etch stop layer defining an etch stop cavity having a stepped profile when viewed in cross-section and that is positioned above said final gate structure and partially between said sidewall spacers;

first and second layers of insulating materials positioned side by side in said etch stop cavity;

a third layer of insulating material positioned above said substrate and said final gate structure; and a conductive contact positioned in an opening formed in at least said third layer of insulating material, said conductive contact being conductively coupled to a contact region of said transistor.

11. The device of claim 10, wherein said first and second layers of insulating material positioned within said etch stop cavity are comprised of the same materials.

12. The device of claim 10, wherein said sidewall spacers have an inner sidewall surface portion extending between said upper surface of said final gate structure and said upper surface of said sidewall spacers, and wherein said etch stop layer is formed on and continuously covers said upper surfaces of said sidewall spacers, said inner sidewall surface portions of said sidewall spacers, and said entirety of said upper surface of said final gate structure.

13. The device of claim 12, wherein said sidewall spacers comprise a first sidewall spacer and a second sidewall spacer positioned on an opposite side of said final gate structure from said first sidewall spacer, wherein a first portion of said etch stop layer covers said inner sidewall surface portion of said first sidewall spacer, and wherein a second portion of said etch stop layer covers said inner sidewall surface portion of said second sidewall spacer, said first layer of insulating material covering said first portion of said etch stop layer and said second layer of insulating material covering said second portion of said etch stop layer.

14. The device of claim 1, wherein said sidewall spacers have an inner sidewall surface portion extending between said upper surface of said final gate structure and said upper surface of said sidewall spacers, and wherein said etch stop layer is formed on and continuously covers said upper surfaces of said sidewall spacers, said inner sidewall surface portions of said sidewall spacers, and said entirety of said upper surface of said final gate structure.

15. The device of claim 1, wherein said sidewall spacers comprise a first sidewall spacer and a second sidewall spacer positioned on an opposite side of said final gate structure from said first sidewall spacer, said first and second sidewall spacers having respective first and second inner sidewall surface portions extending between said upper surface of said final gate structure and said upper surface of said sidewall spacers, wherein said etch stop layer is formed on and continuously covers said upper surfaces of said first and second sidewall spacers, said first and second inner sidewall surface portions of said first and second sidewall spacers, and said entirety of said upper surface of said final gate structure.

16. The device of claim 15, wherein a first portion of said etch stop layer covers said first inner sidewall surface portion of said first sidewall and a second portion of said etch stop layer covers said second inner sidewall surface portion of said second sidewall, said second layer of insulating material covering said first portion of said etch stop layer and said third layer of insulating material covering said second portion of said etch stop layer.

17. The device of claim 9, wherein said sidewall spacers have an inner sidewall surface portion extending between said upper surface of said final gate structure and said upper surface of said sidewall spacers, and wherein said etch stop layer is formed on and continuously covers said upper surfaces of said sidewall spacers, said inner sidewall surface portions of said sidewall spacers, and said entirety of said upper surface of said final gate structure.

* * * * *